United States Patent [19]
Avery

[11] Patent Number: 5,072,273
[45] Date of Patent: Dec. 10, 1991

[54] LOW TRIGGER VOLTAGE SCR PROTECTION DEVICE AND STRUCTURE

[75] Inventor: Leslie R. Avery, Flemington, N.J.

[73] Assignees: David Sarnoff Research Center, Inc., Princeton, N.J.; Sharp Corporation, Tenri, Japan

[21] Appl. No.: 700,314

[22] Filed: May 9, 1991

Related U.S. Application Data

[63] Continuation of Ser. No. 516,498, May 4, 1990, abandoned.

[51] Int. Cl.⁵ .................. H01L 29/72; H01L 29/74; H01L 29/06; H01L 29/78
[52] U.S. Cl. .......................... 357/38; 357/13; 357/23.13; 357/35; 357/86
[58] Field of Search ............ 357/86, 13, 23.13, 35, 357/38; 361/100

[56] References Cited

U.S. PATENT DOCUMENTS

| | | | |
|---|---|---|---|
| 4,513,309 | 4/1985 | Cricchi | 357/42 |
| 4,064,525 | 12/1977 | Kano et al. | 357/13 |
| 4,100,561 | 7/1978 | Ollendorf | 357/86 |
| 4,167,018 | 9/1979 | Ohba et al. | 357/86 |
| 4,176,372 | 11/1979 | Matsushita et al. | 357/86 |
| 4,213,140 | 7/1980 | Okabe et al. | 357/86 |
| 4,224,634 | 9/1980 | Svedberg | 357/38 |
| 4,321,524 | 3/1982 | Petrovic | 323/229 |
| 4,327,368 | 4/1982 | Uchida | 357/42 |
| 4,400,711 | 8/1983 | Avery | 357/43 |
| 4,484,244 | 11/1984 | Avery | 361/56 |
| 4,567,500 | 1/1986 | Avery | 357/38 |
| 4,595,941 | 6/1986 | Avery | 357/43 |
| 4,622,573 | 11/1986 | Bakeman, Jr. et al. | 357/42 |
| 4,631,561 | 12/1986 | Foroni et al. | 357/13 |
| 4,631,567 | 12/1986 | Kokado et al. | 357/38 |
| 4,633,283 | 12/1986 | Avery | 357/23.13 |
| 4,672,584 | 6/1987 | Tsuji et al. | 365/226 |
| 4,683,488 | 7/1987 | Lee et al. | 357/42 |
| 4,760,433 | 7/1988 | Young et al. | 357/23.13 |
| 4,797,724 | 1/1989 | Boler et al. | 357/42 |
| 4,876,584 | 10/1989 | Taylor | 357/23.13 |
| 5,010,380 | 4/1991 | Avery | 357/23.13 |

OTHER PUBLICATIONS

"An Integrated Circuit Composite PNPN Diode", D. C. Goldthorp et al., International Electron Devices Meeting, Washington, D.C.; Dec. 3,4,5, 1979 (IEEE) Technical Digest.

Primary Examiner—J. Carroll
Attorney, Agent, or Firm—William J. Burke

[57] ABSTRACT

A device for protecting an integrated circuit from transient energy is disclosed. This device provides an SCR having a reduced "snap-back" trigger voltage.

15 Claims, 2 Drawing Sheets

LOW TRIGGER VOLTAGE SCR PROTECTION DEVICE AND STRUCTURE

This application is a continuation of application Ser. No. 07/516,498 filed on May 4, 1990, abandoned.

FIELD OF THE INVENTION

The field of the present invention relates generally to protection devices for integrated circuits, and more particularly to low trigger voltage protection devices.

BACKGROUND OF THE INVENTION

Many attempts have been made in the prior art to protect semiconductor devices, including bipolar transistors, field effect devices, and integrated circuits against damage due to voltage and current transients. Such protection devices have commonly taken the form of diode or transistor circuits that have been incorporated on the integrated circuit chip for internal transient protection. The design engineer is nevertheless faced with the problem of having to use valuable chip space for forming protection devices. Particularly on devices containing a large number of pins, it has been found that the protection devices occupy a significant amount of space and, therefore, the chip can become undesirably large.

Protection circuits advantageously utilizing silicon controlled rectifier (SCR) arrangements are known, for example, from Avery, U.S. Pat. No. 4,484,561; Kokado et al., U.S. Pat. No. 4,631,657; and Avery, U.S. Pat. No. 4,633,283.

In typical SCR arrangements utilized in the protection of integrated circuits, the trigger or firing voltage under quasistatic conditions is on the order of 25 volts to 40 volts. However, in practice, pulse conditions typically prevail and the actual trigger voltage is generally higher because of the time taken to establish the plasma. When such an SCR arrangement is utilized as part of an ESD protection circuit on a VLSI chip, for example, damage to other parts of the chip could occur before the "snap-back" SCR conduction regime has been established, i.e. before the SCR has achieved its "shorted" state. It is therefore desirable to achieve a lower trigger voltage for the SCR.

SUMMARY OF THE INVENTION

In accordance with one embodiment of the invention, a protection device comprises first and second terminals, a substrate of a first conductivity type, a first region of second conductivity type in the substrate, a second region of the second conductivity type in the first region, a third region of the first conductivity type in the first region and abutting the second region, a fourth region in the first region and extending beyond the boundary, a fifth region of the second conductivity type and spaced apart from said first region, and a sixth region of the first conductivity type and spaced apart from said first region.

In accordance with yet another embodiment of the invention, a first terminal of the protection device is in electrical contact with the second and third regions, and a second terminal is in electrical contact with the fifth and sixth regions.

In accordance with a further embodiment of the invention, the third and fourth regions are spaced apart to form source and drain regions of a field effect device and wherein a control gate means overlies the region between said third and fourth regions for controlling the degree of conduction between said third and fourth regions.

BRIEF DESCRIPTION OF THE DRAWINGS

In the drawing like items are identified by the same reference numeral and.

DETAILED DESCRIPTION OF THE INVENTION

Figure 1:
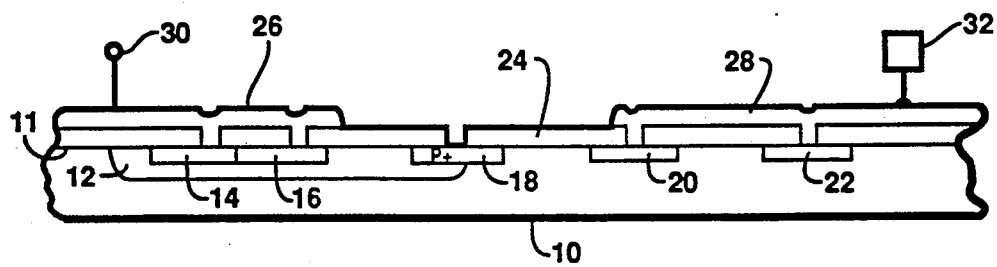
FIG. 1 shows a cross-section, not to scale, of an embodiment of the invention.

In FIG. 1, an embodiment of the present invention is shown which is compatible with typical integrated circuit processing techniques. In FIG. 1, a substrate 10 is composed of a P$^-$ type conductivity semiconductor material such as silicon having a surface 11. It is typically relatively lightly doped, $10^{13}$/cc, and has a relatively low degree of conductivity. A region 12 of N$^-$ type conductivity, also relatively lightly doped and having relatively low conductivity is formed in substrate 10 at the surface 11. This region is usually referred to as a "well", in this case, an N$^-$ well.

N$^-$ well 12 has formed within it near the surface 11 a relatively heavily doped (typically $10^{18}$/cc) N$^+$ type conductivity region 14 and a relatively heavily doped P$^+$ type conductivity region 16, both having relatively high conductivity. Regions 14 and 16 are formed entirely within the boundary of N$^-$ well 12 and preferably abut one another.

A further region 18, is formed in N$^-$ well 12 in part, and in substrate 10 in part, thus extending through the boundary of N$^-$ well 12 into substrate 10. In the further region 18 may be either N$^+$ or P$^+$ conductivity type.

Substrate 10 has also formed within it at the surface 11 a relatively heavily doped N$^+$ type conductivity region 20 and a relatively heavily doped P$^+$ type conductivity region 22. Region 22 preferably abuts region 20. Regions 20 and 22 have relatively high conductivity and are formed entirely outside the boundary of N$^-$ well 12.

Figure 5:
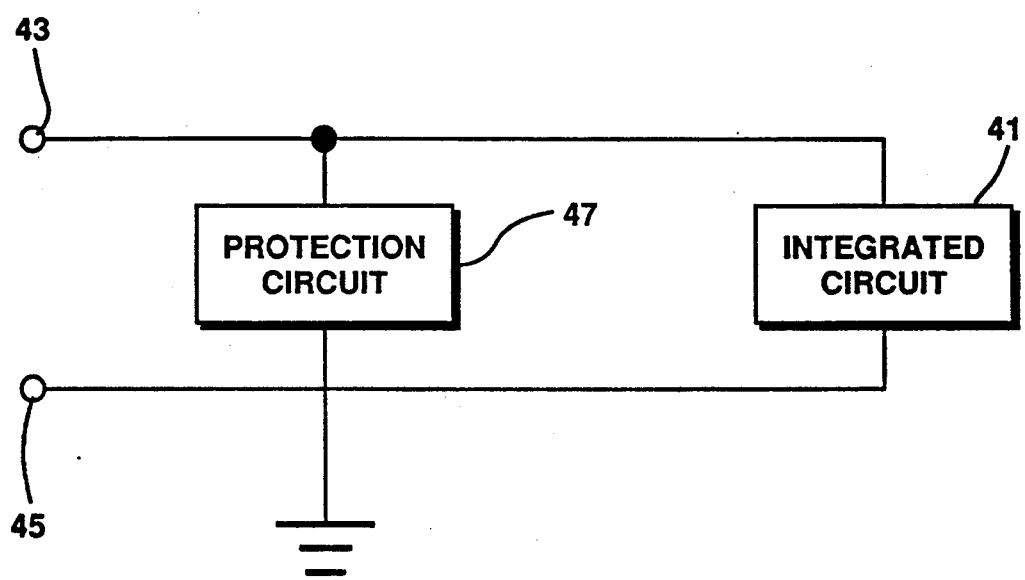
FIG. 5 is a schematic circuit diagram showing the protection circuit of the present invention with an integrated circuit being protected.

The surface 11 of substrate 10 and of the regions formed within it are covered by an insulating layer 24 which may be silicon dioxide, typically about 0.5 micrometers thick. Openings are provided through layer 24 for contacts. A first conductive layer 26, which may be aluminum, molybdenum, silicide or polysilicon, makes contact with each of regions 14 and 16. A second conductive layer 28 makes contact with each of regions 20 and 22. By way of example, conductive layer 26 is here connected to a terminal 30 and conductive layer 28 is connected to terminal 32. For example, FIG. 5 shows one possible arrangement, in which an integrated circuit 41 is connected between a first terminal 43 and a second terminal 45. In the present example, terminal 43 is a supply terminal for a voltage, VDD, of first polarity and terminal 45 is shown as a supply terminal for a reference voltage VSS, typically ground potential. However, terminal 43 can be a signal terminal rather than a supply terminal. In FIG. 5, a protection circuit 47 is connected between terminals 43 and 45, that is, in parallel with integrated circuit 41. Protection circuit 47 thereby protects integrated circuit 41 by turning on in response to transient voltages to conduct transient energy to a source of reference potential, ground in this example.

In operation, the arrangement of FIG. 1 functions as a protective device with "SCR-type" behavior to provide protection when a certain trigger voltage is reached or exceeded. When this has occurred, a low resistance path is provided between terminals 30 and 32 for limiting any voltage excursion. It will be helpful to an understanding of the operation of the protective device of FIG. 1 to consider the equivalent circuit of FIG. 2. The explanation will be simplified by first describing the operation without the presence of region 18.

Figure 2:
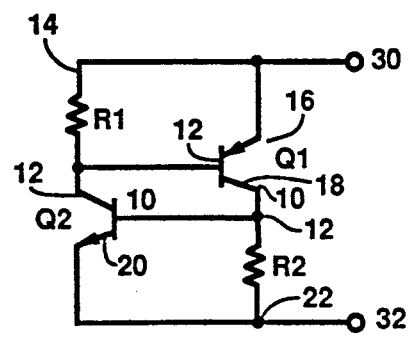
FIG. 2 shows a schematic of an equivalent circuit corresponding to the embodiment of FIG. 1.

Referring to FIGS. 1 and 2, N− well 12 (shown in FIG. 1) forms the base electrode of PNP transistor Q1 and P+ region 16 forms its emitter, connected to terminal 30. P− substrate 10 forms the collector of transistor Q1. Resistor R1, connected between the emitter and base electrodes of transistor Q1, is formed substantially by the part of N− well 12 between region 14 and the edge of N− well 12 closest to N+ region 20.

The emitter of NPN transistor Q2 is formed by N+ region 20. Its base is formed by P− substrate 10 and its collector is formed by N− well 12. The emitter-base shunt resistor R2 is formed substantially by the region between the edge of N− well 12 and P+ region 22. The arrangement of Q1 and Q2 forms an SCR having a threshold level above which it will be triggered into conduction, whereupon a "snap-back" voltage-current characteristic will be exhibited. The effective values of resistances R1 and R2 will primarily affect the value of the "holding current" below which the SCR will "unlatch" and substantially cease conduction.

Figure 3:
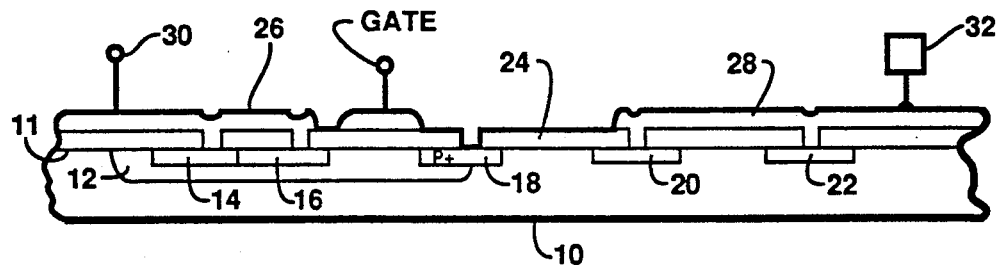
FIGS. 3 and 4 show cross-sections, not to scale, of other embodiments of the invention.

The trigger voltage at which the conduction regime will be initiated is determined by breakdown voltages between component regions of the SCR. In the absence of region 18, triggering of the SCR will occur when the breakdown voltage between N− well 12 and P− substrate 10 is exceeded. In FIG. 3, this breakdown occurs across the junction between the base and collector electrodes of PNP transistor Q1 of NPN transistor Q2. In a typical CMOS process the breakdown voltage will be between about 25 volts and 40 volts but, as earlier stated, the time taken to establish a plasma providing full conduction will result in higher effective "snap-back" trigger voltages for the short pulse durations encountered in typical electrostatic discharge transients.

In FIGS. 1 and 2, because of the higher doping level of region 18, the breakdown voltage between P+ region 18 and N− well 12 will be less than the breakdown voltage between P− substrate 10 and N− well 12. In effect, the P+ region 18 rather than substrate 10 forms the collector electrode of PNP transistor Q1. Accordingly, the lower breakdown voltage will control, and thus a lower "snap-back" trigger voltage for the SCR is achieved. The actual value of the trigger voltage can be controlled to a certain extent by selecting different spacings between P+ region 16 and P+ region 18.

Figure 4:
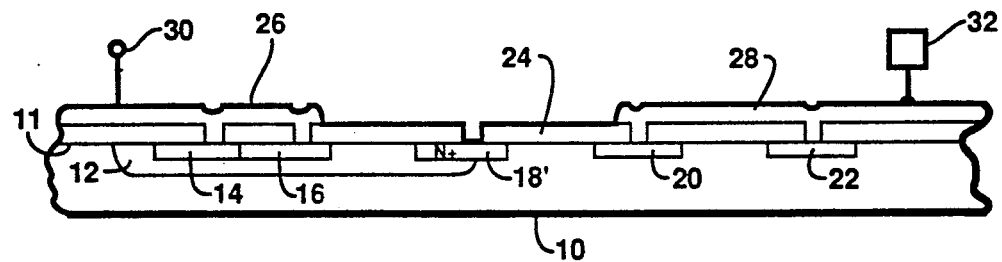

In FIG. 4, the further region 18' is of relatively highly doped N type conductivity material (N+). The breakdown voltage between N+ region 18 and substrate 10 is lower than the breakdown voltage between N− well 12 and substrate 10. Consequently, the trigger voltage for the SCR is lowered in this manner.

Referring now to FIG. 3, a gate electrode overlies the portion of N− well 12 between regions 16 and 18. When the gate electrode is appropriately biased, a conduction channel is established between regions 16 and 18. This is equivalent to conduction in the emitter collector path of PNP transistor Q1 and will lead to a lower trigger voltage for the SCR. By maintaining the gate at a reference potential, appropriate biasing can result from a positive transient potential on conductive layer 26.

The devices of the invention can be fabricated utilizing standard photolithographic and etching steps for definition and ion implantation for forming the doped regions. Typically, a silicon substrate is used with, for example, boron as a P type dopant and phosphorus as an N type dopant, other suitable materials may be used.

Modifications of the various embodiments of the invention may occur to one skilled in the art. For example, while the exemplary embodiment has been described in terms of particular conductivity types, converse conductivity types may be used so long as the relative conductivity types remain the same. Such and like modifications are intended to be within the spirit and scope of the invention, and the appended claims.

I claim:

1. A SCR protection device comprising:
   a semiconductor substrate of a first conductivity type having a surface;
   a first region of second conductivity type in said substrate at said surface and having a boundary with said substrate;
   a second region of said second conductivity type within said first region and at said substrate surface;
   a third region of said first conductivity type within said first region at said substrate surface and adjacent said second region;
   a fourth region, which is of higher conductivity than the first region, in said first region at said substrate surface and extending across the boundary with the substrate into said substrate;
   a fifth region of said second conductivity type in said substrate at said surface and spaced apart from said first region;
   a sixth region of said first conductivity type in said substrate at said surface and spaced apart from said first region;
   a first terminal in electrical contact with both said second and third regions; and
   a second terminal in electrical contact with both said fifth and sixth regions;
   said substrate, first region and fifth region forming a first bipolar transistor of one conductivity type, and said substrate, first region and third region forming a second bipolar transistor of the opposite conductivity type which is connected to the first bipolar transistor to form a SCR.

2. The device of claim 1 wherein said sixth region abuts the fifth region.

3. The device of claim 2 wherein said third and fourth regions are spaced apart along said substrate surface to form source and drain regions of a field effect device and wherein a control gate means overlies and is insulated from the substrate surface between said third and fourth regions for controlling the degree of conduction between said third and fourth regions.

4. The device of claim 1 wherein said fourth region is of said first conductivity type.

5. The device of claim 4 wherein said third and fourth regions are spaced apart along said substrate surface to form source and drain regions of a field effect device and wherein a control gate means overlies and is insulated from the substrate surface between said third and fourth regions for controlling the degree of conduction between said third and fourth regions.

6. The device of claim 1 wherein said fourth region is of said second conductivity type.

7. The device of claim 6 wherein said third and fourth regions are spaced apart along said substrate surface to form source and drain regions of a field effect device and wherein a control gate means overlies and is insulated from the substrate surface between said third and fourth regions for controlling the degree of conduction between said third and fourth regions.

8. A structure comprising:
- an integrated circuit having a first terminal connected to a source of reference potential and a second terminal;
- a SCR protection device having first and second electrodes, each electrode being connected to one of said terminals;
- wherein said protection device comprises:
- a semiconductor substrate of a first conductivity type having a surface;
- a first region of second conductivity type in said substrate at said surface and having a boundary with said substrate;
- a second region of said second conductivity type within said first region at said substrate surface;
- a third region, of said first conductivity type within said first region at said substrate surface and adjacent said second region;
- a fourth region, which is of higher conductivity than said first region, in said first region and extending across the boundary with the substrate into said substrate;
- a fifth region of said second conductivity type in said substrate at said surface outside the boundary of said first region;
- a sixth region of said first conductivity type in said substrate at said surface outside the boundary of said first region; and
- said first terminal is in electrical contact with said second and third regions and said second terminal is in electrical contact with said fifth and sixth regions;
- said substrate, first region and fifth region forming a first bipolar transistor of one conductivity type, and said substrate, first region and third region forming a second bipolar transistor of the opposite conductivity type which is connected to the first bipolar transistor to form a SCR.

9. The device of claim 8 wherein said sixth region abuts the fifth region.

10. The structure of claim 9 wherein said third and fourth regions are spaced apart along said substrate surface to form source and drain regions of a field effect device and wherein a control gate means overlies and is insulated from the substrate surface between said third and fourth regions for controlling the degree of conduction between said third and fourth regions.

11. The structure of claim 10 wherein said fourth region is of said first conductivity type.

12. The structure of claim 10 wherein said fourth region is of said second conductivity type.

13. The structure of claim 8 wherein said second terminal is an input signal terminal of said integrated circuit.

14. The structure of claim 8 wherein said second terminal is an output signal terminal of said integrated circuit.

15. The structure of claim 8 wherein said second terminal is a voltage supply terminal of said integrated circuit.

* * * * *